United States Patent [19]

Aoyama et al.

[11] 4,334,349

[45] Jun. 15, 1982

[54] METHOD OF PRODUCING SEMICONDUCTOR DEVICE

[75] Inventors: Masaharu Aoyama; Jiro Ohshima, both of Yokohama; Toshio Yonezawa, Yokosuka, all of Japan

[73] Assignee: Tokyo Shibaura Denki Kabushiki Kaisha, Japan

[21] Appl. No.: 155,975

[22] Filed: Jun. 3, 1980

[30] Foreign Application Priority Data

Jun. 6, 1979 [JP] Japan ................... 54-71043

[51] Int. Cl.³ ............... H01L 21/225; H01L 21/312; B44C 1/22
[52] U.S. Cl. ...................... 29/579; 29/571; 29/591; 148/1.5; 148/187; 156/652; 156/653; 357/65
[58] Field of Search .............. 29/579, 591, 571; 148/1.5, 187; 156/652, 653; 357/65

[56] References Cited

U.S. PATENT DOCUMENTS

| | | | |
|---|---|---|---|
| 3,839,111 | 10/1974 | Ham et al. | 156/8 |
| 4,030,942 | 6/1977 | Keenam | 148/1.5 |
| 4,045,594 | 8/1977 | Maddocks | 427/89 |
| 4,076,575 | 2/1978 | Chang | 156/643 |
| 4,135,289 | 1/1979 | Brews | 29/571 |
| 4,144,101 | 3/1979 | Rideout | 148/1.5 |
| 4,160,683 | 7/1979 | Roche | 148/1.5 |

FOREIGN PATENT DOCUMENTS

| | | |
|---|---|---|
| 2235749 | 7/1972 | Fed. Rep. of Germany . |
| 48-93268 | 3/1972 | Japan . |
| 49-68684 | 11/1972 | Japan . |
| 50-14368 | 12/1975 | Japan . |
| 51-146343 | 12/1976 | Japan . |
| 54-42540 | 4/1979 | Japan . |
| 1411749 | 10/1975 | United Kingdom . |

*Primary Examiner*—Upendra Roy
*Attorney, Agent, or Firm*—Finnegan, Henderson, Farabow, Garrett & Dunner

[57] ABSTRACT

Disclosed is a method of producing a semiconductor device, comprising the steps of (a) forming a first insulating layer consisting of a lower silicon oxide film and an upper slicon nitride film on the surface of a semiconductor substrate, (b) forming a second insulating layer consisting of silicon oxide on the first insulating layer, (c) forming a third insulating layer consisting of silicon nitride on the second insulating layer, (d) selectively removing the third insulating layer so as to form a mask used for forming a hole for an interconnection electrode, (e) etching away the exposed portion of the second insulating layer by using the mask so as to form the hole for the interconnection electrode, (f) forming a conductive material layer on the entire surface of the structure obtained by step (e), a contact hole formed in the first insulating layer after step (a) or (e) being filled with the conductive material so as to allow the conductive material layer disposed on the first insulating layer to be connected to the semiconductor substrate, and (g) removing the second insulating layer by etching so as to lift-off the third insulating layer and the conductive material layer laminated on the second insulating layer, the remaining conductive materal layer providing the interconnection electrode.

14 Claims, 16 Drawing Figures

METHOD OF PRODUCING SEMICONDUCTOR DEVICE

BACKGROUND OF THE INVENTION

This invention relates to a method of producing semiconductor devices, particularly, to an improvement in the method of forming an interconnection electrode for a semiconductor device.

For forming an interconnection electrode of a semiconductor device, it is popular to remove selectively a conductive material layer by photolithography so as to form an interconnection electrode of a desired pattern. However, this method gives rise to various drawbacks including the following:

1. Where the bonding strength between the conductive material layer and photoresist is not sufficiently high, it is difficult to form an interconnection electrode of a high accuracy.
2. Where the conductive material layer is difficult to be etched, it is difficult to form an interconnection electrode itself.
3. Where it is intended to form an interconnection electrode consisting of a plurality of different metal layers, it is necessary to employ a plurality of etching steps using different etchants.

It is also proposed to employ a lift-off method for forming an interconnection electrode. In this method, a spacer consisting of photoresist or polyimide resin is formed on a silicon oxide insulating layer formed on a semiconductor substrate. The spacer is provided with an opening for forming an interconnection electrode and is used as a mask for selectively etching away the insulating layer so as to form an opening for contact. Then, a conductive material layer is formed on the entire surface. What should be noted is that the conductive material layer is rendered discontinuous at the wall defining the opening of the spacer. Thus, upon removal of the spacer, the conductive material layer formed on the spacer is removed together with the spacer so as to form an interconnection electrode. However, the lift-off method utilizing resin such as photoresist as a spacer gives rise to various drawbacks including the following:

1. Since the lift-off method utilizes discontinuity of a conductive material layer at the wall defining an opening of a spacer, it is necessary to use a relatively thick resin layer as the spacer, rendering it difficult to form a fine interconnection electrode.
2. Since the spacer resin layer is formed by spin coating, the resin layer becomes progressively thicker toward the periphery thereof, resulting in an unnecessary interconnection between the electrode and the resin layer remaining around the insulating layer after the lift-off step. Further, fine resin residue remains on the insulating layer after the lift-off step. It should be noted that the resin residue is decomposed in the annealing step after formation of the interconnection electrode, causing contamination of the semiconductor device.
3. In general, the substrate is kept heated in the step of forming the conductive material layer so as to enable the conductive material to cover the step portion between the substrate and the insulating layer without fail. But, the spacer resin is melted or decomposed by the heat and, thus, rendered incapable of performing the spacer function. If the substrate is not heated, the interconnection electrode, i.e., conductive material layer, fails to cover sufficiently the step portion between the substrate and the insulating layer.
4. The impurities unavoidably contained in the resin layer cause contamination of the semiconductor device in the step of forming the conductive material layer or in the heat treatment step after formation of the interconnection electrode, leading to deterioration of the element characteristics. If cleaning treatment using a mixture of $H_2SO_4$ and $H_2O_2$ is applied to the resin layer for removing the impurities, the resin layer itself is dissolved out, failing to perform the spacer function.

SUMMARY OF THE INVENTION

An object of this invention is to provide a method of producing a semiconductor device, which permits forming an interconnection electrode of very high reliability without impairing the device properties.

Another object is to provide a method which permits forming a fine and accurate interconnection electrode having a side face of gentle slope.

According to this invention, there is provided a method of producing a semiconductor device, comprising the steps of (a) forming a first insulating layer consisting of a lower silicon oxide film and an upper silicon nitride film on the surface of a semiconductor substrate;

(b) forming a second insulating layer consisting of silicon oxide on the first insulating layer;

(c) forming a third insulating layer consisting of silicon nitride on the second insulating layer;

(d) selectively removing the third insulating layer so as to form a mask used for forming a hole for an interconnection electrode;

(e) etching away the exposed portion of the second insulating layer by using the mask so as to form the hole for the interconnection electrode;

(f) forming a conductive material layer on the entire surface of the structure obtained by step (e), a contact hole formed in the first insulation layer after step (a) or (e) being filled with the conductive material so as to allow the conductive material layer disposed on the first insulating layer to be connected to the semiconductor substrate; and (g) removing the second insulating layer by etching so as to lift-off the third insulating layer and the conductive material layer laminated on the second insulating layer, the remaining conductive material layer providing the interconnection electrode.

DETAILED DESCRIPTION OF THE PREFERRED EMBODIMENT

Figure 1A:
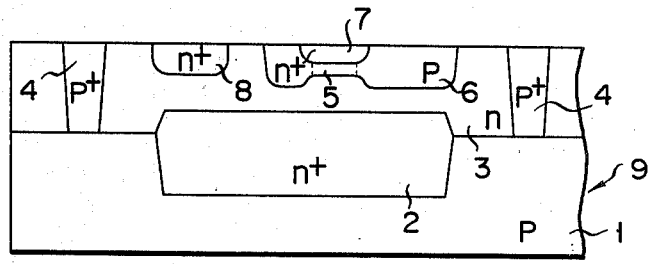
FIGS. 1A to 1F are cross-sectional views collectively showing a method of producing a bipolar transistor according to one embodiment of this invention.

A lift-off technique is employed in the method of this invention. It is important to note that a spacer consisting of a silicon nitride layer and a silicon oxide layer is used in this invention in place of a conventional spacer consisting of resin like photoresist. Specifically, a first insulating layer consisting of a lower silicon oxide film and an upper silicon nitride film is formed on a semiconductor substrate in this invention. Then, a second insulating layer consisting of silicon oxide and a third insulating layer consisting of silicon nitride are successively formed on the first insulating layer. The third insulating layer is selectively removed so as to form a mask used for forming a hole for an interconnection electrode, followed by removing the exposed portion of the second insulating layer by etching. Naturally, side-etching occurs in the second insulating layer, with the result that the third insulating layer overhangs the hole formed in the second insulating layer. Incidentally, the first insulating layer is not etched in this step because the upper film of the first insulating layer consists of silicon nitride. The laminate of the second and third insulating layers having a hole of the particular shape formed therein is used as a spacer in this invention.

As described above, the first insulating layer consists of a lower silicon oxide ($SiO_2$) film and an upper silicon nitride ($Si_3N_4$) film. The $SiO_2$ film and $Si_3N_4$ film should desirably be 1,000 Å to 1.5μ thick and 1,000 to 2,000 Å thick, respectively. It is necessary to form a contact hole in the first insulating layer before the step of forming a conductive material layer. The contact hole may be formed either before the step of forming the second insulating layer or after the step of selectively removing the second insulating layer by etching. It should be noted, however, that, if the contact hole is formed after the selective removal of the second insulating layer, it is necessary to apply masking of, for example, photoresist to the side wall of the laminate consisting of the second and third insulating layers. Thus, it is preferred to form the contact hole before the step of forming the second insulating layer on the first insulating layer.

The thickness of the second insulating layer depends on the thickness of the interconnection electrode formed later and ranges in general between 5,000 Å and 1.5μ. The second insulating layer may be provided by an undoped silicon oxide layer or a doped silicon oxide layer higher in etching rate than the undoped silicon oxide layer. The doped silicon oxide layer mentioned includes, for example, a phosphosilicate glass layer (PSG layer), an arsenosilicate glass layer (AsSG layer), a phosphoarsenosilicate glass layer (PAsSG layer), and a borosilicate glass layer (BSG layer). It is also possible to use a laminate of a plurality of different silicon oxide or glass films. In this case, the lower film should be desirably exhibit the higher etching rate. For example, the second insulating layer may consist of a lower phosphosilicate glass film containing a high concentration of phosphorus and an upper phosphosilicate glass film containing a lower concentration of phosphorus or an undoped silicon oxide film. The second insulating layer of this type permits a hole for an interconnection electrode to be greater in diameter in the lower portion than in the upper portion, rendering it possible to form an interconnection electrode having a side wall of gentle slope.

The third insulating layer, which consists of silicon nitride, should desirably be 1,000 to 2,000 Å thick. It is possible to employ photolithography using photoresist for selectively removing the silicon nitride layer. After selective removal of the silicon nitride layer, the photoresist is etched away by using an etchant consisting of a 3:1 mixture of sulfuric acid and hydrogen peroxide. Since silicon nitride is far more resistant to the etchant than photoresist, the photoresist can be removed completely. Of course, the photoresist does not remain on the silicon nitride layer.

The second insulating layer is selectively removed by etching with the remaining third insulating layer used as a mask. The etching time should desirably be at least 1.5 times as long as the time required for the etched portion of the second insulating layer to reach the bottom of the second insulating layer. The etching time mentioned permits the second insulating layer to be etched sideways, with the result that the third insulating layer overhangs the hole made by the etching of the second insulating layer. It follows that a conductive material layer formed in the subsequent step is made discontinuous without fail, rendering it possible to remove easily the conductive material layer disposed on the third insulating layer.

The conductive material used in this invention includes, for example, Al metal, Al alloys such as Al-Si, Al-Cu and Al-Si-Cu, polycrystalline silicon, and a three-layer structure of Ti, Pt and Au. It should be noted, however, that Al metal and Al alloys are not satisfactory in resistance to the etchant used for etching the second insulating layer after formation of the conductive material layer. Thus, the conductive material layer, if formed of Al or Al alloy, should desirably be coated with a metal highly resistant to the etchant, e.g., Ti, Cr, Ni or Pt.

The interconnection electrode is connected to the surface of the semiconductor substrate via a contact hole formed in the first insulating layer. In order to lower a contact resistance between the substrate and the interconnection electrode, a metal silicide layer having a high melting point such as platinum silicide or molybdenum silicide may be formed on the surface of the substrate before the step of forming the interconnection electrode.

Described in the following are Examples of the method of this invention applied to the production bipolar transistors.

EXAMPLE 1

As shown in FIG. 1A, an n+ buried layer 2 was selectively formed in a p-type silicon substrate 1, followed by forming an n-type epitaxial layer 3 on the substrate by epitaxial growth. Then, a high concentration of boron was selectively diffused into the epitaxial layer 3 so as to form p+ channel cut regions 4, followed by selectively diffusing boron ions into the epitaxial layer 3 so as to form an internal base region 5 and an external base region 6. Further, arsenic was diffused into the internal base region 5 and the epitaxial layer 3 so as to form an emitter region 7 and a collector region 8, respectively, thereby providing a semiconductor substrate 9 as shown in FIG. 1A.

Then, interconnection electrode layers respectively connected to the external base region 6, emitter region 7 and collector region 8 were formed by the method of this invention. However, it is thought sufficient to describe the process of forming only the interconnection electrode layer connected to the external base region 6.

Figure 1B:
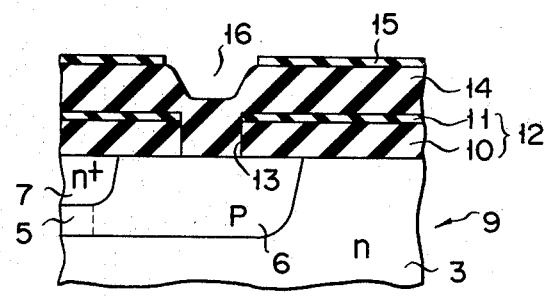

As shown in FIG. 1B, a first insulating layer 12 consisting of a lower silicon oxide film 10 having a thickness of 2,000 Å and an upper silicon nitride film 11 having a thickness of 1,000 Å was formed by CVD on the surface of the semiconductor substrate 9, followed by selectively etching away the first insulating layer 12 by photolithography so as to form a contact hole 13. Then, a silicon oxide layer 14 having a thickness of $1\mu$ (second insulating layer) and a silicon nitride layer 15 having a thickness of 1,000 Å (third insulating layer) were successively formed by CVD on the first insulating layer 12, followed by selectively etching away the silicon nitride layer 15 by photolithography so as to form an opening 16.

Figure 1C:
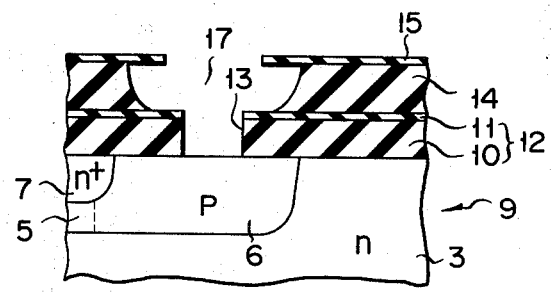

Then, the silicon oxide layer 14 was selectively etched away by using the remaining portion of the silicon nitride layer 15 as a mask. A mixture of NH$_4$F and HF was used as an etchant and the etching time was 1.5 times as long as the time required for the etched portion of the silicon oxide layer 14 to reach the surface of the substrate 9. As a result, a hole 17 for an interconnection electrode larger than the opening 16 formed in the silicon nitride layer 15 was formed in the silicon oxide layer 14 as shown in FIG. 1C. In other words, the silicon nitride layer 15 was allowed to overhang the hole 17. Naturally, the silicon oxide layer 14 positioned in the contact hole 13 formed in the first insulating layer 12 was also removed so as to expose the external base region 6 of the substrate. Incidentally, the first insulating layer 12 was not etched away in this step because of the presence of the upper silicon nitride film 11.

Figure 1D:
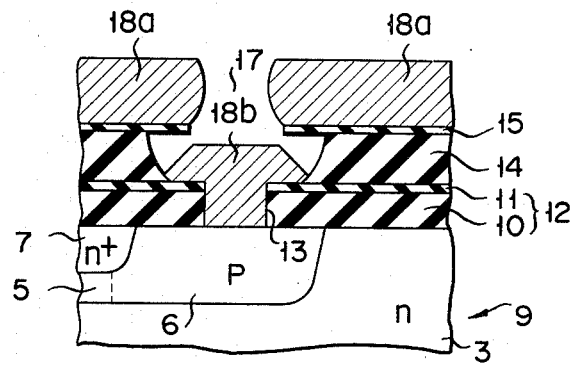

After formation of the hole 17, an aluminum layer was formed on the entire surface by sputtering with the substrate 9 heated to about 200° C. As shown in FIG. 1D, an aluminum layer 18b formed on the first insulating layer 12 within the hole 17 was completely separate from an aluminum layer 18a formed on the silicon nitride layer 15. Obviously, the discontinuity of the aluminum layer was due to the presence of the silicon nitride layer 15 overhanging the hole 17. Naturally, the contact hole 13 was filled with aluminum so as to connect the aluminum layer 18b formed on the first insulating layer 12 to the external base region 6 of the substrate 9. Further, the aluminum layer 18b was allowed to have side faces of gentle slope.

Figure 1E:
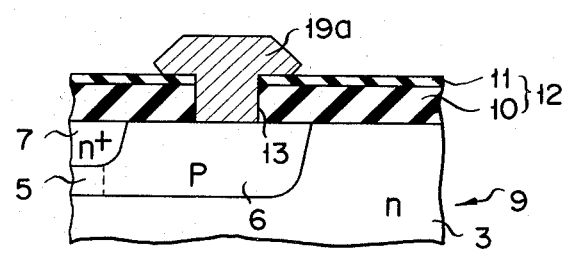

Then, the silicon oxide layer 14 (second insulating layer) was etched away with a mixture of NH$_4$F and HF, so as to lift-off the silicon nitride layer 15 and the aluminum layer 18a laminated on the silicon oxide layer as shown in FIG. 1E. Incidentally, the aluminum layer 18b shown in FIG. 1D constitutes an interconnection electrode 19a connected to the base region of the substrate 9 as shown in FIG. 1E.

Figure 1F:
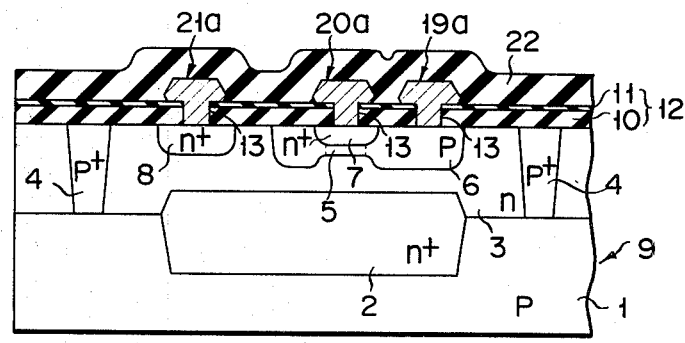

An interconnection electrode 20a connected to the emitter region and an interconnection electrode 21a connected to the collector region were also formed by the same process as described above. Finally, a support layer 22 consisting of SiO$_2$ was formed by CVD on the entire surface so as to produce a bipolar transistor as shown in FIG. 1F.

In the method described above, the spacer for the lift-off function was formed of silicon oxide and silicon nitride in place of resin, rendering it possible to form the aluminum layer while heating the semiconductor substrate 9. As a result, the contact hole 13 formed in the first insulating layer 12 was completely filled with aluminum, namely, the interconnection electrode formed was quite satisfactory in step coverage. Also, the interconnection electrode was fine and highly accurate and enabled to have side faces of gentle slope. Further, the semiconductor substrate was not contaminated in the step of forming the aluminum layer because resin was not used as the spacer. Thus, the produced bipolar transistor exhibited satisfactory element characteristics.

EXAMPLE 2

Figure 2A:
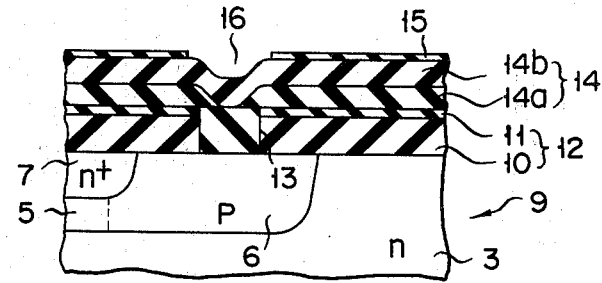
FIGS. 2A to 2F are cross-sectional views collectively showing a method of producing a bipolar transistor according to another embodiment of this invention.

As shown in FIG. 2A, a first insulating layer 12 consisting of a lower silicon oxide film 10 having a thickness of 2,000 Å and an upper silicon nitride film 11 having a thickness of 1,000 Å was formed by CVD on the surface of a semiconductor substrate 9 equal in construction to that used in Example 1. Then, the first insulating layer 12 was selectively etched away by photolithography so as to form a contact hole 13 partly exposing an external base region 6 of the substrate, followed by the forming a second insulating layer 14 on the first insulating layer 12. The second insulating layer 14 consisted of a lower phosphosilicate glass film 14a doped with $1.5 \times 10^{21}$ atoms/cm$^3$ of phosphorus and having a thickness of $0.5\mu$ (PSG film) and an upper undoped silicon oxide film 14b having a thickness of $0.5\mu$ (SiO$_2$ film). Further, a silicon nitride layer 15 (third insulating layer) having a thickness of 1,000 Å was formed by CVD on the second insulating layer 14, followed by selectively etching away the silicon nitride layer 15 by photolithography using photoresist so as to form an opening 16. Incidentally, the photoresist on the remaining silicon nitride layer 15 was completely removed after formation of the opening 16.

Figure 2B:
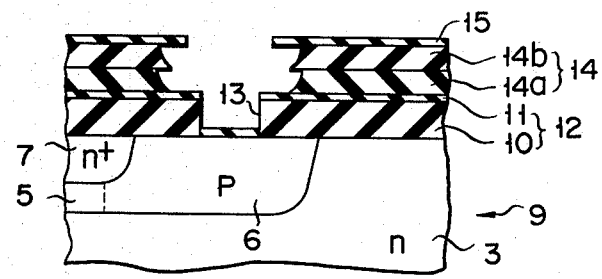
Figure 2C:
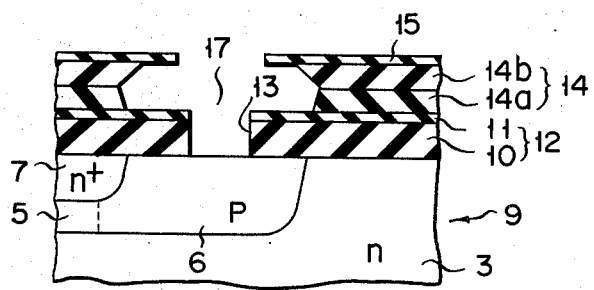

Then, the second insulating layer 14 was selectively etched away with an etchant consisting of NH$_4$F and HF, with the remaining silicon nitride layer 15 used as a mask. The etching time was 1.5 times as long as that required for the etched portion of the second insulating layer 14 to reach the bottom of the second insulating layer 14. As seen from FIG. 2B, the lower PSG film 14a of the second insulating layer 14 was etched faster than the upper SiO$_2$ film 14b, with the result that a step was formed between the upper and lower films 14b and 14a. After completion of etching, a hole 17 for an interconnection electrode was formed in the second insulating layer 14 as shown in FIG. 2C. The diameter of the hole 17 was larger in the lower portion than in the upper portion and the silicon nitride layer 15 was allowed to overhang the hole 17. Naturally, the second insulating layer filling the contact hole 13 formed in the first insulating layer was also etched away so as to expose the external base region 6 of the substrate 9. Incidentally, the first insulating layer 12 was not etched because of the presence of the upper silicon nitride film 11.

Figure 2D:
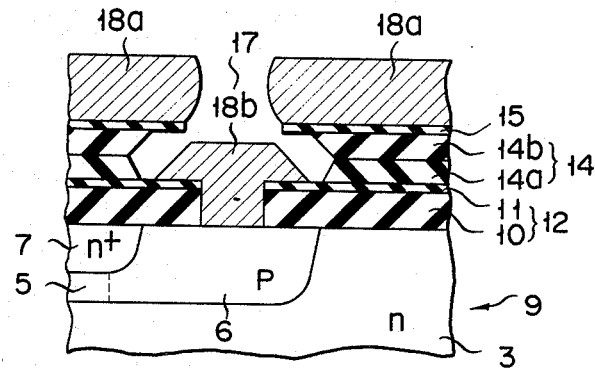

After formation of the hole 17, an Al layer was formed on the entire surface by sputtering while heating the substrate 9 to about 200° C. As shown in FIG. 2D, an Al layer 18b formed on the first insulating layer 12 within the hole 17 was completely separate from an Al layer 18a formed on the silicon nitride layer 15. Obviously, the discontinuity of the Al layer was due to the presence of the silicon nitride layer 15 overhanging the hole 17. Naturally, the contact hole 13 was filled with Al so as to connect the Al layer 18b formed on the first insulating layer 12 to the external base region 6 of the substrate 9. Further, the Al layer 18b was allowed to have side faces of gentle slope.

Figure 2E:
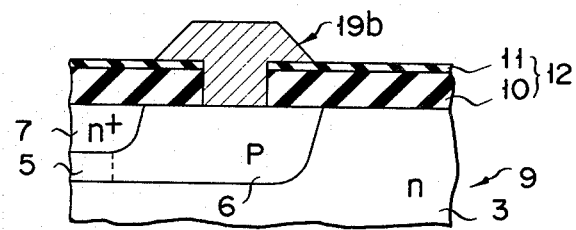

Then, the second insulating layer 14 consisting of the PSG film 14a and SiO₂ film 14b was etched away with an etchant of NH₄F—HF mixture so as to lift-off the silicon nitride layer 15 and the Al layer 18a laminated on the second insulating layer 14. Incidentally, the Al layer 18b shown in FIG. 2D constitutes an interconnection electrode 19b connected to the base region of the substrate 9 as shown in FIG. 2E.

Figure 2F:
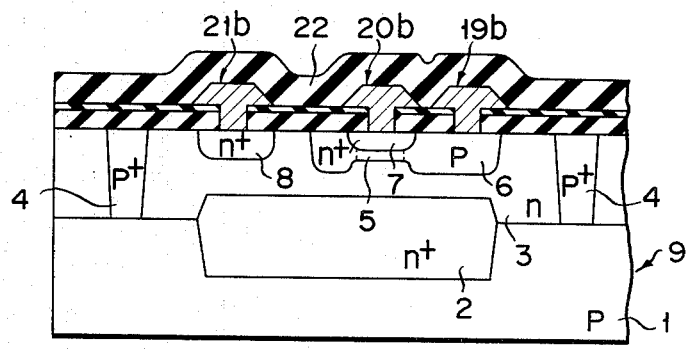

An interconnection electrode 20b connected to the emitter region and an interconnection electrode 21b connected to the collector region were also formed by the same process as described above. Finally, a support layer 22 consisting of SiO₂ was formed by CVD on the entire surface so as to produce a bipolar transistor as shown in FIG. 2F.

The bipolar transistor thus produced was substantially equal in properties to the one produced in Example 1. It is particularly important to note that the interconnection electrodes 19b, 20b and 21b were allowed to have side faces of very gentle slope. As a result, a second interconnection electrode formed on the SiO₂ layer 22 is rendered free from breakage in the regions above the interconnection electrodes 19b, 20b, 21b, leading to a multi-layer interconnection of high reliability.

EXAMPLE 3

Figure 3A:
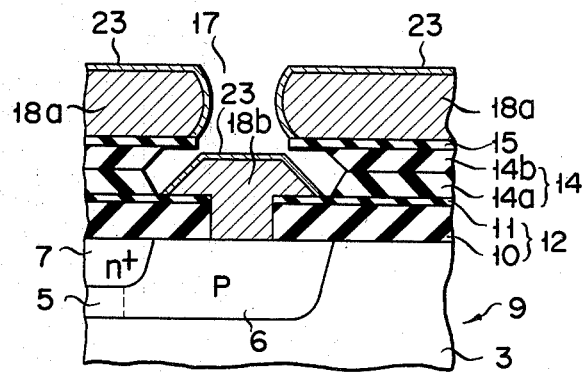
FIGS. 3A to 3C are cross-sectional views collectively showing a method of producing a bipolar transistor according to still another embodiment of this invention.
Figure 3B:
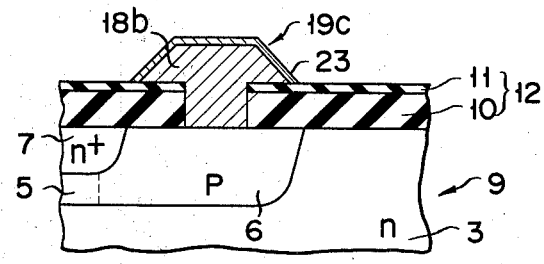

As shown in FIG. 3A, a Ti layer 23 excellent in resistance to etching was formed on the surfaces of the Al layers 18a and 18b included in the structure of FIG. 2D. Then, the second insulating layer 14 consisting of the PSG film 14a and SiO₂ film 14b was etched away with an NH₄F—HF mixture so as to lift-off the silicon nitride layer 15 and the Al layer 18a laminated on the second insulating layer 14. Of course, the Ti layer covering the Al layer 18a was removed together. However, the Ti layer 23 covering the Al layer 18b was not corroded at all by the etchant, leading to the formation of a satisfactory interconnection electrode 19c connected to the base region of the substrate 9 as shown in FIG. 3B.

Figure 3C:
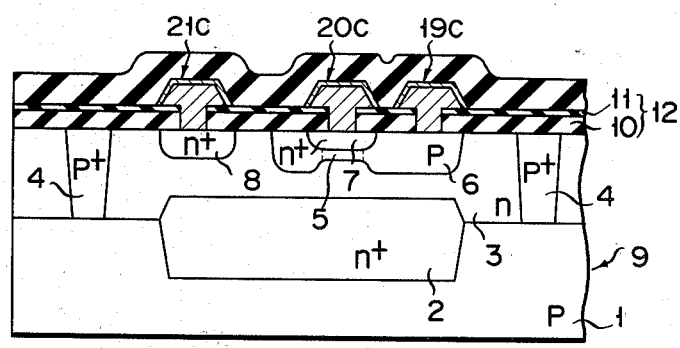

An interconnection electrode 20c connected to the emitter region and an interconnection electrode 21c connected to the collector region were also formed by the same process as described above. Finally, an SiO₂ layer 22 was formed on the entire surface by CVD so as to produce a bipolar transistor as shown in FIG. 3C.

The interconnection electrodes included in the produced bipolar transistor were highly accurate and had very smooth surfaces compared with those for examples 1 and 2.

Figure 4:
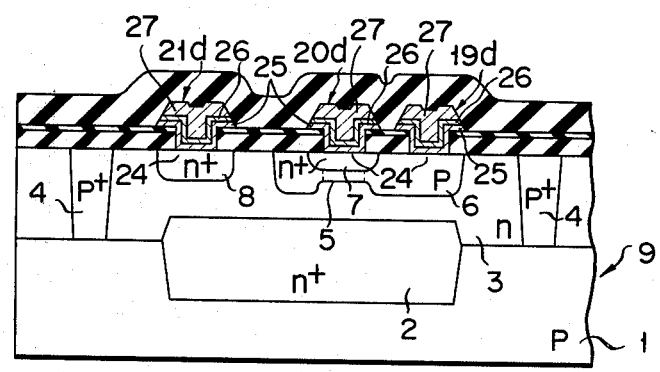
FIG. 4 is a cross-sectional view of a bipolar transistor produced by an additional embodiment of the method of this invention.

FIG. 4 shows an additional embodiment of this invention. In this embodiment, the base region 6, emitter region 7 and collector region 8 exposed by the contact holes 13 formed in the first insulating layer 12 are covered with a metal silicide film, e.g., platinum silicide film 24, having a high melting point. Then, holes for interconnection electrodes are formed as in Examples 1 to 3, followed by forming a Ti layer 25, a Pt layer 26 and an Au layer 27 successively in place of the Al layer formed in Examples 1 to 3. Naturally, the three metal layers laminated on the second insulating layer are removed by the lift-off technique as in the preceding Examples so as to form interconnection electrodes 19d, 20d, 21d of three-layer structure connected to the base, emitter and collector, respectively.

As described above in detail, the method of this invention produces various effects including the following:

1. Since the spacer for the lift-off function consists of a silicon oxide layer and a silicon nitride layer, it is possible to heat the semiconductor substrate in the step of forming a conductive material layer. As a result, the conductive material layer is enabled to achieve a sufficient step coverage.
2. Since a silicon nitride layer is allowed to overhang a hole for an interconnection electrode, the conductive material layer is rendered discontinuous without fail at the wall defining the hole mentioned above, rendering it possible to form a fine and accurate interconnection electrode. Further, the interconnection electrode is enabled to have side faces of gentle slope. As a result, a second interconnection electrode formed thereon via an insulating film is rendered free from breakage at the regions above the side faces of the first interconnection electrode.
3. A resin layer is not used as the spacer and the photoresist used for patterning the spacer is removed substantially completely, namely, the photoresist does not remain at all on the spacer. As a result, an impurity does not enter the semiconductor substrate in the step of forming a conductive material layer and in the step of annealing an interconnection electrode, rendering it possible to prevent the semiconductor substrate from contamination.

As described above in detail, the method of this invention permits producing a semiconductor device comprising an interconnection electrode of very high reliability without impairing the device properties.

What we claim is:

1. A method of producing a semiconductor device, comprising the steps of:
    (a) forming a first insulating layer comprising a lower silicon oxide film and an upper silicon nitride film on a surface of a semiconductor substrate;
    (b) forming a contact hole through said first insulating layer;
    (c) forming a second insulating layer consisting of silicon oxide on the first insulating layer;
    (d) forming a third insulating layer consisting of silicon nitride on the second insulating layer;
    (e) selectively removing the third insulating layer to form a mask used for forming a hole for an interconnection electrode;
    (f) etching away the exposed portion of the second insulating layer by using the mask to form the hole for the interconnection electrode;
    (g) forming a conductive material layer on the entire surface of the structure obtained by step (f), the contact hole formed in the first insulating layer being filled with the conductive material to allow the conductive material layer disposed on the first insulating layer to be connected to the semiconductor substrate; and
    (h) removing the second insulating layer by etching to lift-off the third insulating layer and the conductive material layer laminated on the second insulating layer, the remaining conductive material layer providing the interconnection electrode.

2. The method according to claim 1 wherein the second insulating layer consists of a plurality of silicon oxide films differing from each other in impurity concentration such that the lower film exhibits the higher etching rate.

3. The method according to claim 1, wherein the conductive material layer is selected from the group consisting of an Al layer, an Al alloy layer, a polycrystalline silicon layer and a three-layer structure of Ti, Pt and Au.

4. The method according to claim 2, wherein the second insulating layer consists of a lower film of an impurity-doped silicon oxide and an upper film of undoped silicon oxide.

5. A method of producing a semiconductor device comprising the steps of:
  (a) forming a first insulating layer comprising a lower silicon oxide film and an upper silicon nitride film on a surface of a semiconductor substrate;
  (b) forming a second insulating layer of silicon oxide on the first insulating layer;
  (c) forming a third insulating layer of silicon nitride on the second insulating layer;
  (d) selectively removing the third insulating layer to form a mask used for forming a hole used for an interconnection electrode;
  (e) etching away the exposed portion of the second insulating layer by using the mask to form the hole for the interconnection electrode;
  (f) forming a contact hole in the first insulating layer;
  (g) forming a conductive material layer on the entire surface of the structure obtained by step (f), the contact hole formed in the first insulating layer being filled with the conductive material so as to allow the conductive material there disposed on the first insulating layer to be connected to the semiconductor substrate; and
  (h) removing the second insulating layer by etching to lift-off the third insulating layer and the conductive material laminated on the second insulating layer, the remaining conductive material providing the interconnection electrode.

6. The method according to claim 5, wherein the second insulating layer consists of a plurality of silicon oxide films differing from each other in impurity concentration such that the lower film exhibits the higher etching rate.

7. The method according to claim 5, wherein the conductive material layer is selected from the group consisting of an Al layer, an Al alloy layer, a polycrystalline silicon layer and a three-layer structure of Ti, Pt and Au.

8. The method according to claim 6, wherein the second insulating layer consists of a lower film of an impurity-doped silicon oxide and an upper film of undoped silicon oxide.

9. The method according to claim 1, 2, 5, or 6 wherein the etching time of the second insulating layer is at least 1.5 times as long as that required for the etched portion to reach the bottom of the second insulating layer.

10. The method according to claim 2, 3, 6 or 8, wherein the impurity is at least one element selected from phosphorus, arsenic and boron.

11. The method according to claim 1, 2, 5 or 6 wherein a platinum silicide layer or a molybdenum silicide layer is formed on the surface of the semiconductor substrate exposed by the contact hole formed in the first insulating layer before the step of forming the conductive material layer.

12. The method according to claim 1, 2, 3, 5, 6 or 7 wherein the conductive material layer is covered with a metal layer resistant to the etchant used for etching the second insulating layer.

13. The method according to claim 12, wherein the metal layer covering the conductive material layer is formed of a metal selected from the group conprising Ti, Cr, Ni and Pt.

14. A method of producing a semiconductor device, comprising the steps of:
  (a) forming a first insulating layer comprising a lower silicon oxide film and an upper silicon oxide nitride film on a surface of a semiconductor substrate, the thickness of the first insulating layer being in the range of 1,000 A to 1.5 thick;
  (b) forming a contact hole in the first insulating layer;
  (c) forming a second insulating layer of silicon oxide on the first insulating layer, the second insulating layer being in the range of 5,000 A to 1.5 thick;
  (d) forming a third insulating layer consisting of silicon nitride on the second insulating layer, the third insulating layer being in the range of 1,000 A to 2,000 A thick;
  (e) selectively removing the third insulating layer to form a mask used for forming a hole for an interconnection electrode;
  (f) etching away the exposed portion of the second insulating layer by using the mask to form the hole for the interconnection electrode;
  (g) forming a conductive material layer on the entire surface of the structure attained by step (f), the contact hole formed in the first insulating layer being filled with the conductive material to allow the conductive material layer disposed on the first insulating layer to be connected to the semiconductor substrate; and
  (h) removing the second insulating layer by etching to lift off the third insulating layer and the conducting material layer laminated on the second insulating layer, the remaining conductive material layer providing the interconnection electrode.

* * * * *